(12) United States Patent
Sturm et al.

(10) Patent No.: US 10,306,792 B2
(45) Date of Patent: May 28, 2019

(54) ELECTRONICS UNIT (71) Applicant: ebm-papst Mulfingen GmbH & Co. KG, Mulfingen (DE)

(72) Inventors: Michael Sturm, Bad Mergentheim (DE); Thomas Sauer, Bad Mergentheim (DE); Matthias Maschke, Kupferzell (DE)

(73) Assignee: ebm-papst Mulfingan GmbH & Co. KG, Mulfingen (DE)

(*) Notice: Subject to any disclaimer, the term of this patent is extended or adjusted under 35 U.S.C. 154(b) by 177 days.

(21) Appl. No.: 15/335,524

(22) Filed: Oct. 27, 2016

(65) Prior Publication Data
US 2017/0135238 A1 May 11, 2017

(30) Foreign Application Priority Data
Nov. 5, 2015 (DE) .................. 10 2015 119 002

(51) Int. Cl.
| | |
|---|---|
| *H02K 5/00* | (2006.01) |
| *H02K 5/02* | (2006.01) |
| *H02K 5/06* | (2006.01) |
| *H02K 11/30* | (2016.01) |
| *H05K 5/03* | (2006.01) |
| *H02K 5/10* | (2006.01) |
| *H02K 5/22* | (2006.01) |
| *H05K 5/00* | (2006.01) |
| *H05K 5/02* | (2006.01) |
| *H05K 5/06* | (2006.01) |

(52) U.S. Cl.
CPC ................ *H05K 5/03* (2013.01); *H02K 5/10* (2013.01); *H02K 5/225* (2013.01); *H02K 11/30* (2016.01); *H05K 5/0017* (2013.01); *H05K 5/0026* (2013.01); *H05K 5/0217* (2013.01); *H05K 5/069* (2013.01); *H02K 2211/03* (2013.01)

(58) Field of Classification Search
CPC ........ H02K 5/0026; H02K 5/03; H02K 5/026; H02K 5/0017; H02K 11/30; H02K 2211/03
USPC ............................................. 310/68 R, 71, 89
See application file for complete search history.

(56) References Cited

U.S. PATENT DOCUMENTS

| | | | | |
|---|---|---|---|---|
| 4,451,750 A | * | 5/1984 | Heuer | H02K 5/225 310/71 |
| 4,963,778 A | * | 10/1990 | Jensen | H02K 5/225 310/160 |
| 6,229,232 B1 | * | 5/2001 | Roth-Stielow | H02K 5/225 310/160 |

(Continued)

FOREIGN PATENT DOCUMENTS

| | | |
|---|---|---|
| DE | 10313274 A1 | 2/2004 |
| EP | 2043234 | 4/2009 |
| EP | 2226922 A1 | 9/2010 |

*Primary Examiner* — John K Kim
(74) *Attorney, Agent, or Firm* — Harness, Dickey & Pierce, P.L.C.

(57) ABSTRACT

An electronics unit and an electromotor with such an electronics unit is provided with a sealing arrangement which seals an interface structural group mounted on a printed circuit board against an inside of the electronics housing as well as on the front side in the area of the plug interface in such a manner that the inside of the electronics housing is sealed against the entrance of a liquid even in the not-in-use state of a connection box of the electronics unit.

19 Claims, 5 Drawing Sheets

(56) References Cited

U.S. PATENT DOCUMENTS

| | | | | |
|---|---|---|---|---|
| 7,939,978 B2* | 5/2011 | Best | ............... | H02K 11/33 310/71 |
| 8,278,790 B2* | 10/2012 | Rueggen | ............... | H02K 11/33 310/68 D |
| 8,810,090 B2* | 8/2014 | Gruetzmacher | ....... | H02K 5/225 310/68 R |
| 2009/0079281 A1* | 3/2009 | Best | ............... | H02K 5/225 310/71 |
| 2015/0295467 A1* | 10/2015 | Hattori | ............... | H02K 5/225 310/71 |
| 2015/0333589 A1* | 11/2015 | De Filippis | ............... | H02K 5/10 310/71 |
| 2017/0135238 A1* | 5/2017 | Sturm | ............... | H02K 5/10 |

* cited by examiner

ELECTRONICS UNIT

CROSS-REFERENCE TO RELATED APPLICATIONS

This application claims the benefit and priority of DE 1020151190028, filed Nov. 5, 2015. The entire disclosure of the above application is incorporated herein by reference.

FIELD

The present disclosure relates to an electronic unit and to an electromotor with such an electronic unit. In addition, the disclosure also relates to certain components essential for the disclosure (e.g. as replacement part) of the electromotor and/or of the electronic unit.

BACKGROUND

The IP protective type standardized internationally for many decades indicates the suitability of electric operating means for various defined environmental conditions and ensures the protection of persons against potential danger from an electric shock during their use.

In many electrical applications electrical and electronic devices must function safely and reliably under difficult environmental conditions for many years. Aside from the admissible temperature, the corrosive load, which includes the resistance to aggressive media in the industry such as moisture, water, vapors, acids, lyes, oil or fuels, represents a limitation of use.

Moreover, the contacting and/or the penetration of foreign bodies and of dust as well as the contamination by bacteria and viruses (in medical technology) or the mechanical load by the effect of impacts must be prevented for a reliable functioning and a safe usage.

The IP protective types are defined in a standardized manner in the IEC/EN 60529. Two characterizing digits are added to the letters IP which are always present in the designation of the protective type. They show which protective scope a housing offers regarding contact and/or foreign bodies (first characterizing digit) and moisture and/or water (second characterizing digit).

The international standard EN 60034-part 5 and/or the concordance VDE 0530-5 applies for the division of the protective types of rotating electrical machines through a housing. It sets the requirements on the housings which is suitable in every other regard for their intended usage and insure regarding the materials and working that the qualities indicated in the standard are preserved during usage in accordance with the regulations.

A generic electromotor is described in DE 103 13 274 A1. It concerns in particular a motor with a motor housing that is substantially closed or encapsulated with a protective type. The electromotor consists of a stator and of an outer rotor surrounding the stator from one side in a cup-like manner as part of the motor housing and of an electronic housing which contains control electronics following as a further part of the motor housing the side axially opposite the outer rotor. The motor housing is constructed to be substantially closed or encapsulated.

In this electromotor the electronic housing comprises an opening for the electrical connection, wherein this opening can be tightly closed with a connection plug connector connected to outer connection lines. However, it was previously always the case with such known motors that permanently connected, in particular welded lines were provided for all inner connections, as was also the case in EP 2 226 922 A1.

A disadvantage is the fact that such constructions have, as is known, a tightness which is not permanently reliable and that moisture can penetrate under certain operating conditions into the motor housing, which is to be avoided.

EP 2 043 234 A1 shows a solution for this in which the electronics housing is sealed by appropriate sealing planes and sealing agents. It is provided to this end that all inner electrical connections between the connection device and the control electronics and/or between the control electronics and the stator interconnection arrangement are constructed as plug connections which are preferably aligned as regards their plugging direction and their loosening direction according to a motor axis and axially parallel to it, wherein the plug connections between the control electronics and the stator interconnection device extend through a separating wall of a stator flange in a sealing manner.

Furthermore, a connection device which comprises an intermediate carrier as terminal box is provided which carries connection contacts for the outer connection lines and contact elements of the plug connections for the control electronics, wherein the intermediate carrier comprises several seals for the sealing contact on the wall of the electronic housing in the area of through contact openings of the wall of the electronics housing. The terminal box is provided with a flat plug and inserted into a terminal box receptacle formed in the housing. Therefore, depending on the construction type, several sealing ranges provided in the axial direction are disadvantageously provided in different sealing planes.

It is therefore desirable to avoid a series of disadvantages resulting from this. Since every seal has application-specific sealing problems, it is advantageous to generally reduce the number of seals. Furthermore, when coordinating various combined structural components and structural components of an electronics unit the tolerances and resulting tolerance chains can only be managed with high costs. It is necessary, in particular in the case of several sealing planes present in an axial direction to exactly coordinate with one another the tolerances of the structural components contributing to the seal and the configuration of the seals.

Furthermore, there is no seal to the printed circuit board and therefore to the control electronics as long as or as soon as the terminal box has not been mounted or dismounted.

It is furthermore desirable to reduce the number of plug connections and accordingly the number of contact transitions. A transition resistance and therefore the development of heat is associated with each contact transition. Furthermore, it is disadvantageous in the previously cited solution that the risk of damage to the contacts occurs. Therefore, it can occur that the plug pins (signal contacts) as well as the maintenance connection contacts can be bent or damaged during transport, the mounting and/or, e.g., during the handling of the connection wiring. Therefore, a certain mounting sequence is also necessary when "blindly" joining when combining the structural parts.

The high number of structural components in the complex construction are furthermore disadvantageous in the solutions known in the prior art.

SUMMARY

The present disclosure therefore has the task of overcoming these disadvantages and to make available an improved solution which comprises in particular optimized structural components and is for a sealed electronics unit with a sealed interface and an electromotor with such an electronics unit.

A basic concept of the present disclosure is that an interface structural group arranged on a printed circuit board is provided which is sealed on the one hand in its interface area and on the other hand opposite the electronics housing surrounding the printed circuit board so that the inside of the electronics housing is also sealed in the not-in-use state of a connection box against the entrance of a liquid. Furthermore, to this end according to the disclosure, the number of contact transitions is reduced, as a result of which the sealing plane can be arranged in the area of the wall between the distributor housing and the interface area. In this manner the connection bases used in the prior art and integrated in the connection box can be eliminated, as a result of which the number of parts can be further reduced.

Moreover, as a result, the connection plug connectors can be readily prepared outside of the connection box and then directly plugged onto the corresponding contacts of the interface structural group.

Therefore, according to the disclosure an electronics unit for an electromotor is made available which is constructed with an electronics housing in which a control electronics arranged on a printed circuit board is arranged on which an interface structural group with a plug interface comprising contacts is fastened for inserting at least one connection plug connector, wherein the electronics housing comprises a receiving area in which a connection box for connecting the connection plug connector or connectors can be set as authorized. Furthermore, according to the disclosure, the interface structural group is sealed by a sealing arrangement against an inner side of the electronics housing as well as on the front in the area of the plug interface in such a manner that the interior of the electronics housing is sealed against the entrance of a liquid even when not mounted or being used.

A preferred embodiment of the disclosure provides that the receiving area for the connection box is arranged above the plug interface, preferably above an opening formed in a wall of the electronics housing.

Another preferred embodiment of the disclosure provides that the interface structural group comprises a contact carrier housing with a housing wall on which a circumferential seal is applied preferably along the front section of this housing wall which seal rests in a sealing manner against an inner sealing surface in the electronics housing.

Furthermore, it is advantageously provided that the interface structural group comprises a contact carrier housing on which holding elements, preferably constructed to be integral with the contact carrier housing, on which or by means of which the interface structural group is fastened on the printed circuit board. It is furthermore preferred to also provide indexing domes in addition to, e.g. catch arms that can be inserted into the printed circuit board, which domes fit to corresponding indexing openings on the printed circuit board. Furthermore, housing sections with openings can also be advantageously provided on the contact carrier housing for being screwed with corresponding fastening holes in the printed circuit board.

In another advantageous embodiment of the disclosure the contacts of the interface structural group comprise a connection end of the printed circuit board which, e.g., are designed as welded contact ends or as press-in areas.

It is furthermore preferred if the electronics housing forms in the receiving area for the connection box a wall graduated in the axial direction with a contact area elevated opposite a first wall area for the connection box, wherein a circumferential seal of the sealing arrangement rests against the inside, preferably against the inside in the elevated contact area of the wall of the electronics housing.

Furthermore, it is advantageous if a part of the sealing arrangement arranged in the area of the plug interface surrounds at least partially the contact of the interface structural group and rests directly on it.

Accordingly, the sealing arrangement preferably consists of a first and of a second seal in which the one seal rests as a seal against a wall of the electronics housing and a second seal seals the front side of the interface.

Another advantageous embodiment of the disclosure provides that the connection box comprises a receiving space and at least one cable passage preferably constructed in one piece with the connection box (e.g. a cable screwing) for at least one connection plug connector provided with a connection cable and comprises a bottom constructed with at least one mounting opening through which a connection plug connector can be inserted or mounted for making contact with the interface structural group preferably by moving in or catching in the connection box. Therefore, a catching geometry is provided in the connection box in an especially advantageous manner which cooperates with a counter-catching geometry on the plug connector.

Alternatively, a catching geometry for engaging the plug connector directly to the housing of the interface structural group can also be attached.

Furthermore, it is advantageous if the connection box furthermore comprises a cover which can be dismounted and is sealed by a sealing means, which cover is preferably provided with an integrated active or passive element such as, e.g., an optical waveguide and/or with an integrated antenna.

It is also advantageous if the electronics housing is provided above the receiving area for the connection box with a dismountable cover, preferably with integrated antenna and also preferably with a status report display.

A first advantageous embodiment of the disclosure provides that the bottom of the connection box has a contour corresponding to the graduated wall.

In order to protect the contacts, it can be advantageously provided on account of the integration of the contacts into the interface structural group that a housing wall surrounding the contacts is provided in the contact carrier housing of the interface structural group and projects with its front side in the axial direction opposite the plug-side ends of the contacts.

In addition, it can be provided that an antenna and/or an NFC choke and/or an optical waveguide is/are arranged or integrated in a sealing manner in the interface structural group.

In a preferred embodiment the electronics housing is constructed as a cup-shaped housing with a circumferential, annular housing flange, wherein in addition the recess for the connection box is arranged as a laterally open recess in the cup-shaped housing.

Another aspect of the present disclosure relates to an electromotor, preferably an outer rotor motor with an electronics unit in accordance with the invention as previously described.

Other advantageous further developments of the disclosure are characterized in the subclaims and are presented in detail in the following together with the description of the preferred execution of the invention using the figures.

DESCRIPTION

The disclosure is described in the following with reference made to the FIGS. 1 to 5 using an exemplary embodiment, wherein the same reference numerals in the figures refer to the same functional and/or structural features.

Figure 1:
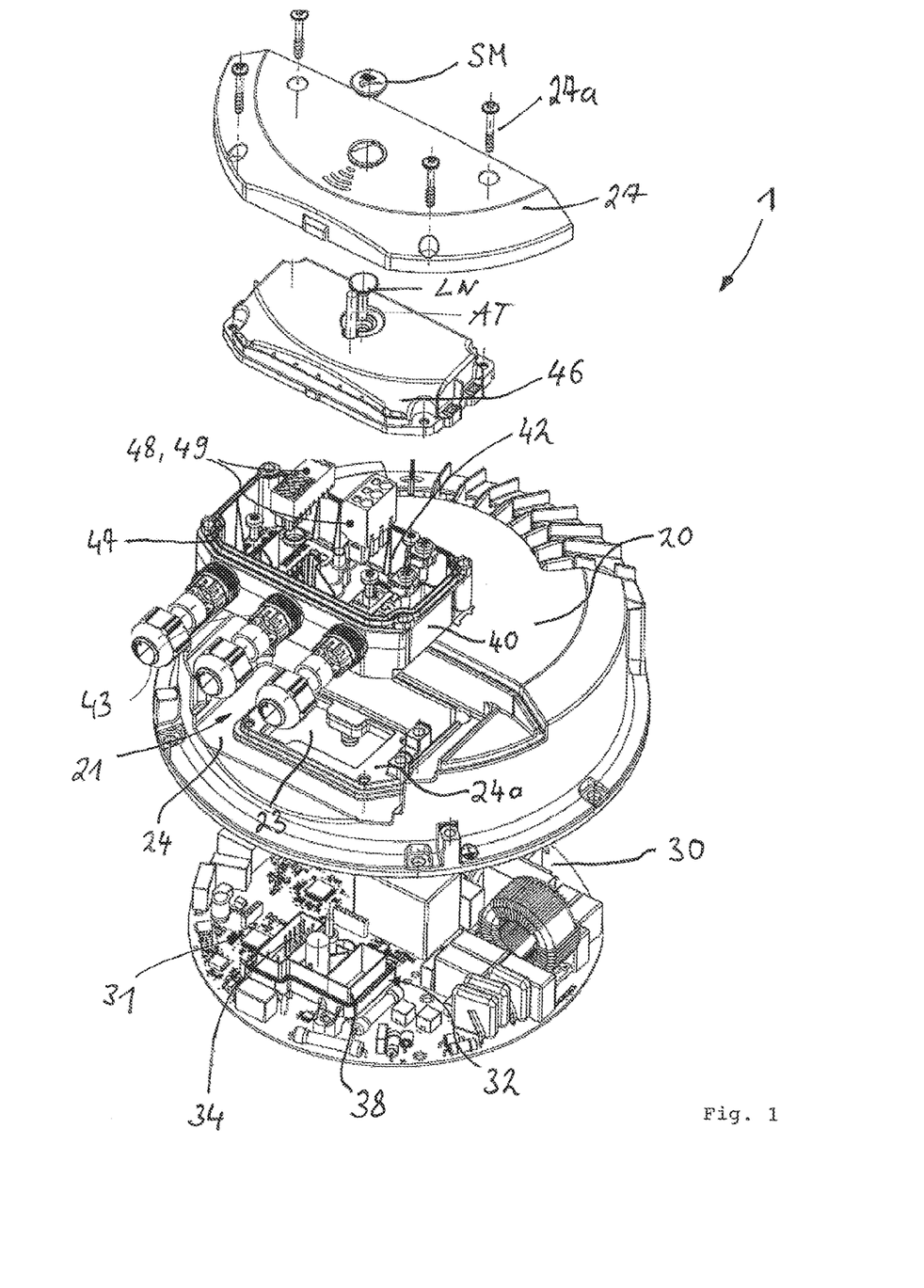
FIG. 1 Shows an isometric exploded view of an exemplary embodiment of an electronics unit, FIG. 2 Shows an isometric exploded view of the electronics unit similar to FIG. 1, wherein another assembled construction state is illustrated, FIG. 3 Shows an isometric view from below and from above onto the interface structural group of the disclosure, FIG. 4 A perspective view onto the electronics housing without mounted connection box, and FIG. 5 A sectional view through a part of the electronics unit.
Figure 2:
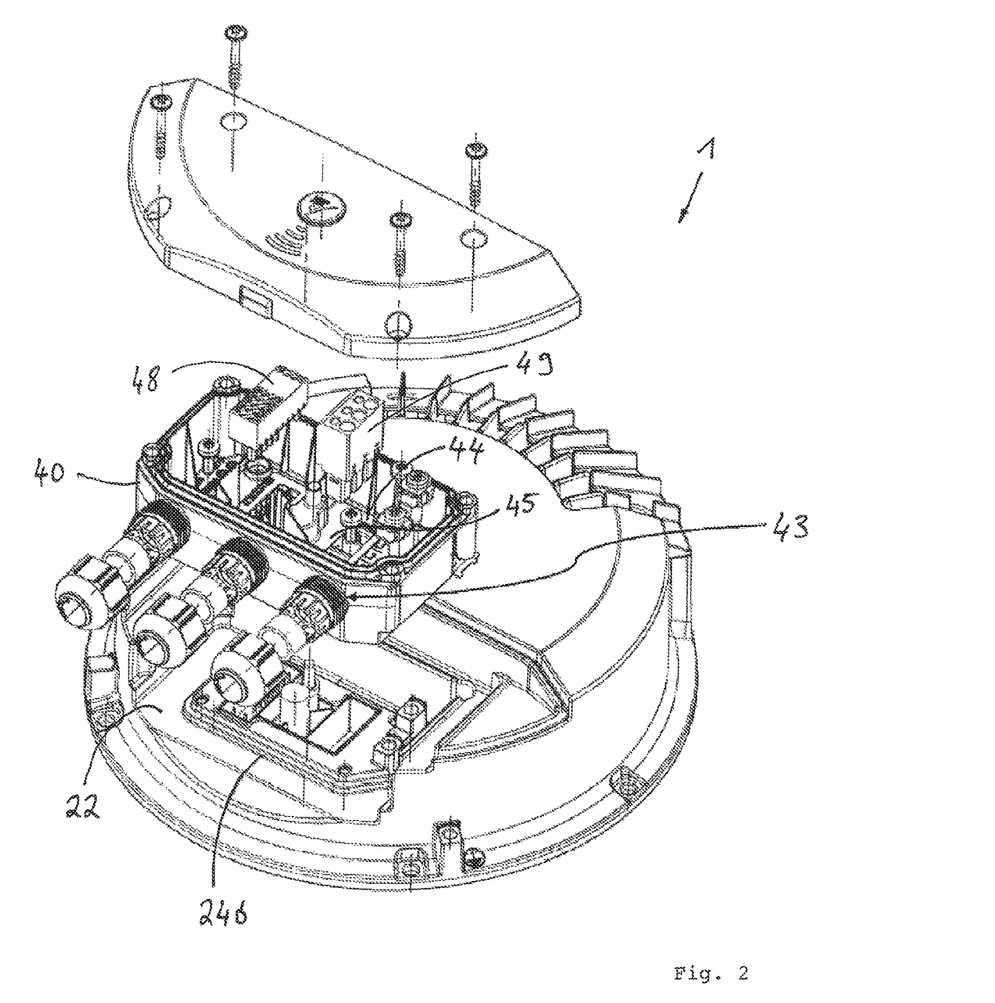

The FIGS. 1 and 2 show isometric exploded views of an exemplary embodiment of an electronics unit 1 according to the disclosure. The electronic unit 1 comprises a printed circuit board 30, and electronics housing 20 and a connection box 40 which are described in detail in the following.

Figure 4:
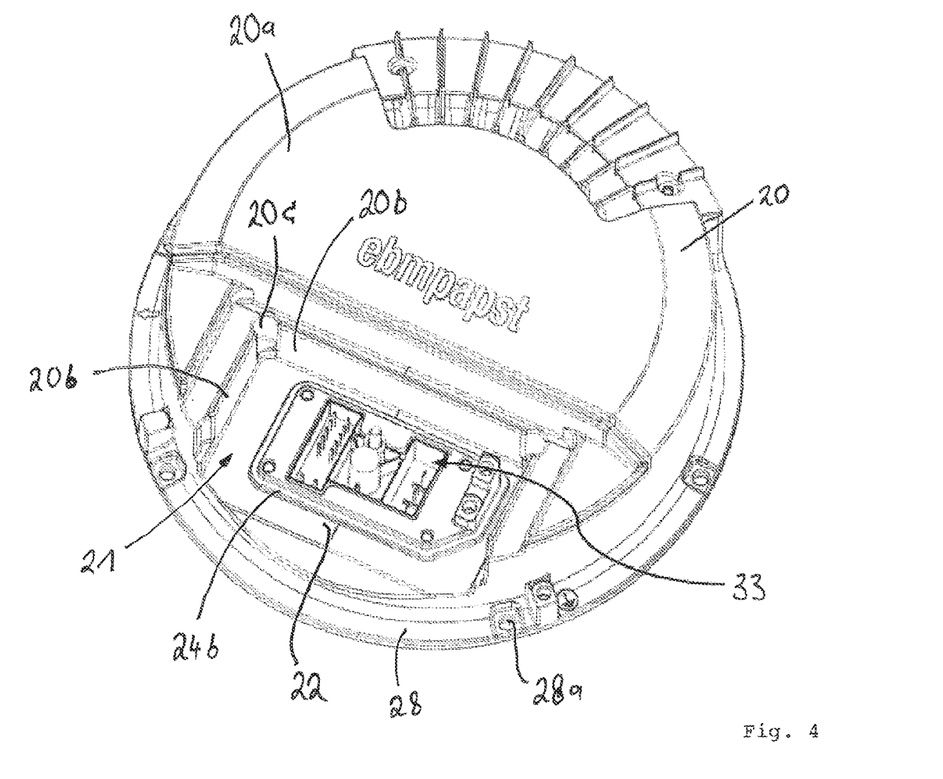

As can be recognized in FIG. 4 the electronics housing 20 has a cup-shaped form wherein a housing flange 28 is provided on its circumference with fastening openings 28a. As can be also recognized in FIG. 4, a receiving area 21 is provided in the cup-shaped electronics housing 20 which is area is constructed as a housing recess and as a receiving area 21 open to the outside into which a connection box 40 to be described later can be inserted and mounted. A wall 22 running substantially parallel to the cover surface 20a is provided in the receiving area 21. An opening 23 is provided in the wall 22 through which the interface structural group 32 which is mounted on the printed circuit board 30 is accessible. A first wall area 24 (see FIG. 1) and a support area 24a which is elevated opposite the first wall area 24 and which is elevated opposite the first wall area 24 by two steps 24b (see FIGS. 2 and 4) opposite the first wall section 24 are present in the area of the receiving area 21. The previously cited opening 23 is located inside the elevated support area 24a. Furthermore, as can be clearly recognized in the FIG. 2 and FIG. 4, the steps 24b run around the elevated support area 24a and therefore surround the opening 23. The inside 25 in the area of the steps 24b and of the elevated support area 24a make available a support surface for the seal 36, which can be recognized in more detail in the FIG. 5, of the interface structural group 32. In other words, this means that the seal 36, which is provided on the front side of the interface structural group 32, rests against an appropriately corresponding support surface on the inside 25 of the electronics housing 20. The receiving area 21 is limited on three sides by step-like walls 20b along which cylindrical recesses 20c are located for pre-centering the connection box 40 on correspondingly formed corner areas of the connection box 40.

Figure 3:
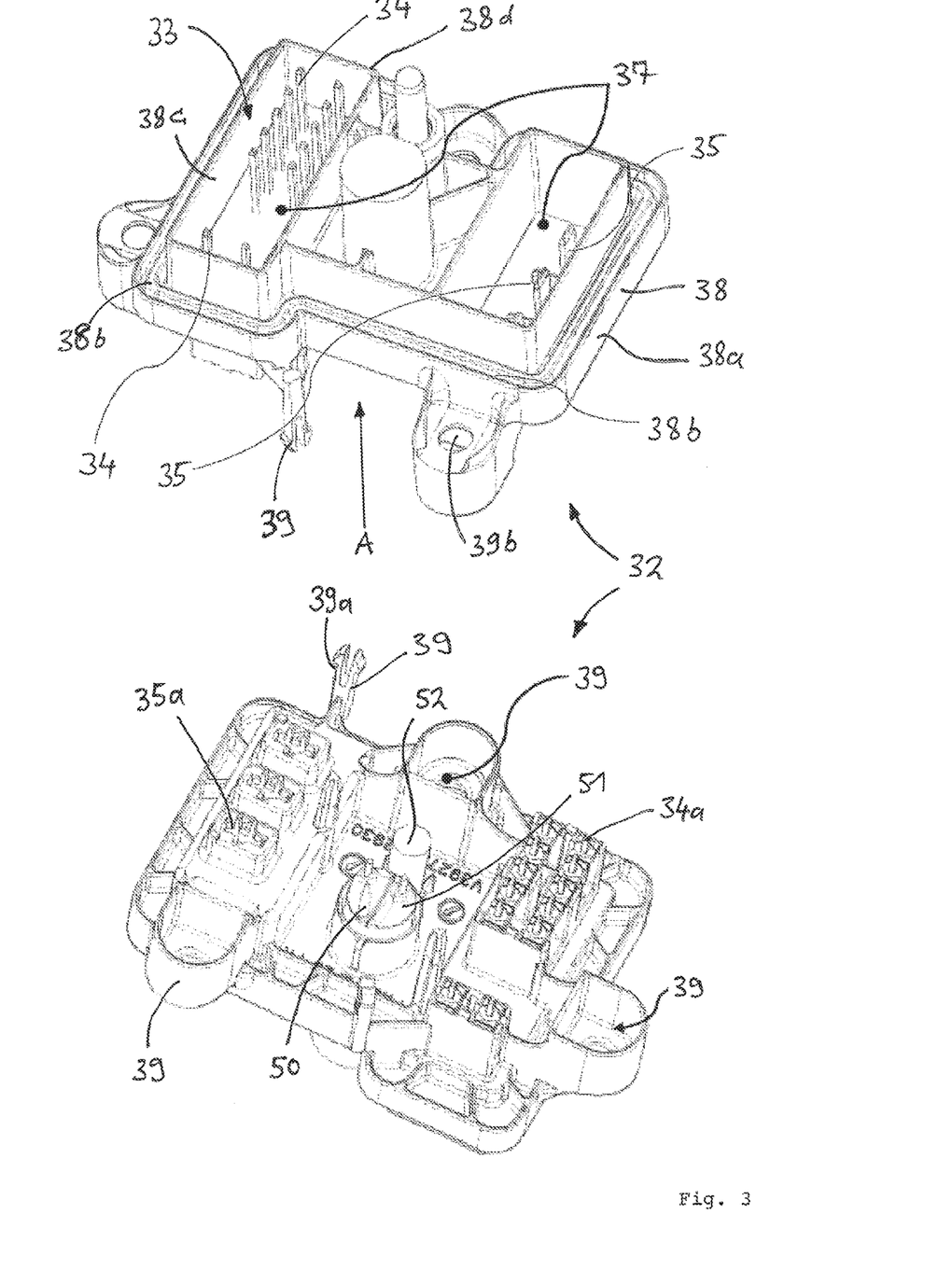
Figure 5:
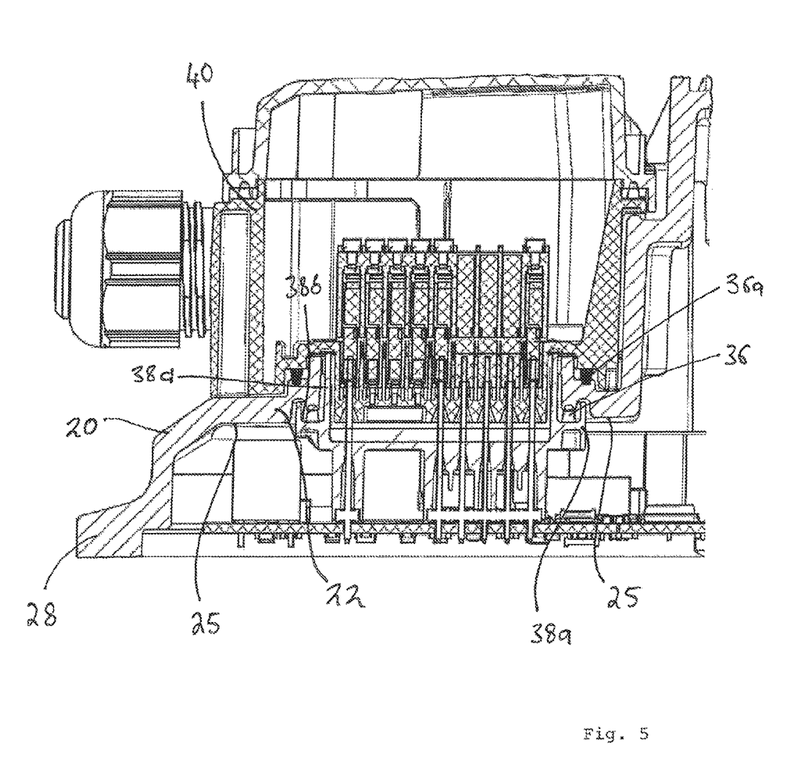

FIG. 3 shows an interface structural group 32 according to the disclosure in an upper and a lower view. The interface structural group 32 is arranged on the printed circuit board 30 together with a control electronics 31. The interface structural group 32 comprises a contact carrier housing 38 in which contacts 34, 35 (signal and power contacts) are arranged. As can be seen in the lower view of FIG. 3, the contacts 34, 35 comprises contact connection ends 34a, 35a for mounting the printed circuit board. The contact carrier housing 38 comprises a housing wall 38a front side section 38b which is constructed in the present case in the shape of a conduit for receiving a seal 36 as is shown in FIG. 5. Furthermore, a second housing wall 38c is provided around the contacts 34, 35 whose front side 38d projects beyond the contact ends of the contacts 34 and 35 so that a contact protection against bending of the contacts is made available. The contacts are surrounded in the area of the plug interface 33 by the seal 37, namely a cast mass so that the plug interface 33 is sealed on the front side. Furthermore, as is apparent in FIG. 3 the interface structural group 32 comprises holding elements 39 which are constructed in the present case with a catch hook section 39a in order to fasten the interface structural group 32 in a locking manner on or to the printed circuit board 30. Furthermore, other holding elements 39 are provided with openings 39b for a further fastening possibility of the interface structural group 32 on the printed circuit board 30.

In the present exemplary embodiment the interface structural group 32 furthermore comprises an antenna 50 in the form of an NFC choke 51 as well as an optical waveguide 52. As soon as the electronics housing 20 is in its proper position opposite the printed circuit board 30, the seal 36 lies against the inside 25 of the electronics housing 20 and seals the inside of the electronics housing 20 in accordance with regulations. Furthermore, since the plug interface 33 is sealed by the previously cited sealing agent 37, i.e., the cast mass 37, there is therefore a seal against the entrance of a liquid even in the non-mounted state of the connection box 40. The seals 36, 37 are preferably designed in such a manner that that a seal against moisture/dust is ensured in accordance with the international IP protective type according to IP X4 and IP X5 or higher.

It is especially advantageous in this regard if the seal 36 is constructed as a soft-component seal.

Another component of the electronics unit 1 shown in the FIGS. 1 to 5 is the connection box 40. The dismountable connection box 40 is designed as authorized in its shape in such a manner that it can be correspondingly mounted in the receiving area 21 of the electronics housing 20 and can preferably be connected to the electronics housing 20 by fastening means. The connection box 40 serves to receive the connection plug connectors 48, 49 which are provided as authorized, to contact the contacts 34, 35 of the interface structural group 32 and to be inserted into the interface structural group 32. To this end the connection box 40 comprises a receiving area 42 in which the connection plug connectors 48, 49 are found. In the present exemplary embodiment the connection box 40 comprises three cable passages 43 with cable screwings on the side through each of which a connection cable can be run into the box in order to be connected to the connection plug connectors 48, 49. After the connection plug connectors 48, 49 have been advantageously connected or prepared outside of the receiving area 42 of the connection box 40 they can be inserted into the interface structural group 32 when the connection box 40 is mounted in its authorized position in the receiving area 21 of the electronics housing 20. To this end the bottom 44 of the connection box 40 comprises a mounting opening 45 through which the mounting of the connection plug connectors 48, 49 is possible. Furthermore, the connection box 40 comprises a dismountable cover 46 which closes the connection box 40 in a sealing manner by a seal 47. To this end the cover 47 can be screwed to the fastening points of the connection box 40. In the present exemplary embodiment the cover 47 comprises an integrated antenna AT and an integrated optical waveguide LW so that a transfer of the light signal of the status-reporting LED is made possible via the integrated, sealed optical waveguide. A choke antenna AT for sending and receiving radio signals or for radio programming via the near-field communication method is integrated in the cover 46. A housing cover 27 of the electronics housing 20, which covers the connection box 40 in the mounted state, is located above the cover 46 of the connection box 40. In the present embodiment the housing cover 27 can be engaged with the cover 46 of the connection box 40 and jointly fastened to it on mounting openings on the connection box 40 by screws 27a.

FIG. 5 shows a sectional view through a part of the electronics unit 1. The sealing planes and seals 36, 37 and 47 can be readily recognized. It can furthermore be recognized that the seal 36 is arranged in the previously cited conduit-shaped front side section 38b of the housing wall 38a and rests in a sealing manner against an inside 25 of the electronics housing 20 in the area of the receiving area 21.

Furthermore, it is apparent with the aid of the figures that an advantageous joining process and a mounting-friendly connection possibility of the electronics unit 1 are given by the present disclosure. Furthermore, based on the special interface design of the interface structural group 32, a broad scalability of the coating of contacts is possible and application-specific arrangements of signal- and power contacts and therefore specific interface configurations can be realized.

The disclosure is not limited in its implementation to the previously indicated preferred electronics but rather a number of variants can be conceived which make use of the presented solution even in the case of embodiments which are basically differently conceived.

The invention claimed is:

1. An electronics unit for an electromotor comprising:
   an electronics housing in which control electronics are arranged on a printed circuit board;
   an interface structural group with a plug interface comprising contacts and for inserting at least one connection plug connector; wherein
   the electronics housing includes a receiving area into which a connection box can be inserted in an authorized manner for connecting the at least one connection plug connector, and
   at least one sealing arrangement seals the interface structural group against an inside of the electronics housing as well as on the front side in an area of the plug interface in such a manner that the inside of the electronics housing is sealed in the non-used state of the connection box against the entrance of a liquid; and
   the connection box further comprises a dismountable cover sealed against the connection box by a seal, an integrated optical waveguide (LW) and an integrated antenna (AT).

2. The electronics unit according to claim 1, wherein the receiving area for the connection box is arranged above the plug interface.

3. The electronics unit according to claim 1, wherein the interface structural group comprises a contact carrier housing with a housing wall on which a circumferential seal is attached along a front side section of the housing wall.

4. The electronics unit according to claim 1, wherein the interface structural group comprises a contact carrier on which holding elements, constructed to be integral with a contact carrier housing, are fastened on or by means of which the interface structural group is fastened on the printed circuit board.

5. The electronics unit according to claim 1, wherein a seal arranged in the area of the plug interface and designed as a cast mass at least partially surrounds as part of the sealing arrangement the contacts of the interface structural group and rests directly on them.

6. The electronics unit according claim 1, wherein the connection box comprises a receiving space and a cable passage constructed in one piece with the connection box for at least one connection plug connector provided with a connection cable and comprises a bottom constructed with at least one mounting opening through which a connection plug connector can be inserted or mounted for making contact with the interface structural group preferably engaging in the connection box.

7. The electronics unit according to claim 1, wherein a housing wall surrounding the contacts is provided in a contact carrier housing and which projects with its front side in axial direction (D) opposite a plug-side ends of the contacts.

8. The electronics unit according to claim 1, wherein at least one of an antenna, an NFC choke, and an optical waveguide is arranged in the interface structural group.

9. The electronics unit according to claim 1, wherein the electronics housing is constructed as a cup-shaped housing with a circumferential, annular housing flange.

10. An electromotor having an outer rotor motor with an electronics unit according to claim 1.

11. An electronics unit for an electromotor comprising:
    an electronics housing in which control electronics are arranged on a printed circuit board;
    an interface structural group with a plug interface comprising contacts and for inserting at least one connection plug connector; wherein
    the electronics housing includes a receiving area into which a connection box can be inserted in an authorized manner for connecting the at least one connection plug connector, the electronics housing is provided above the receiving area for the connection box with a dismountable cover, an integrated antenna and a status report display (SM); and
    at least one sealing arrangement positioned, at least partially around the contacts of the plug interface, seals the interface structural group against an inside of the electronics housing as well as on the front side in such a manner that the inside of the electronics housing is sealed against the entrance of a liquid when the connection box is not connected with the electronics housing.

12. The electronics unit according to claim 11, wherein the electronics housing forms in the receiving area for the connection box a wall graduated in an axial direction with a contact area elevated opposite a first wall area for the connection box, wherein a circumferential seal of the sealing arrangement rests against the inside in the elevated contact area of the wall.

13. The electronics unit according to claim 12, wherein a bottom of the connection box has a contour corresponding to the graduated wall.

14. The electronics unit according to claim 11, wherein the interface structural group comprises a contact carrier housing with a housing wall on which a circumferential seal is attached along a front side section of the housing wall.

15. The electronics unit according to claim 11, wherein the interface structural group comprises a contact carrier on which holding elements, constructed to be integral with a contact carrier housing, are fastened on or by means of which the interface structural group is fastened on the printed circuit board.

16. The electronics unit according to claim 11, wherein a housing wall surrounding the contacts is provided in a contact carrier housing and which projects with its front side in axial direction (D) opposite a plug-side ends of the contacts.

17. The electronics unit according to claim 11, wherein at least one of an antenna, an NFC choke, and an optical waveguide is arranged in the interface structural group.

18. The electronics unit according to claim 11, wherein the electronics housing is constructed as a cup-shaped housing with a circumferential, annular housing flange.

19. An electromotor having an outer rotor motor with an electronics unit according to claim 11.

* * * * *

UNITED STATES PATENT AND TRADEMARK OFFICE
CERTIFICATE OF CORRECTION

PATENT NO. : 10,306,792 B2  
APPLICATION NO. : 15/335524  
DATED : May 28, 2019  
INVENTOR(S) : Michael Sturm et al.

Page 1 of 1

It is certified that error appears in the above-identified patent and that said Letters Patent is hereby corrected as shown below:

On the Title Page (73) Assignee
Line 1 "Mulfingan" should be --Mulfingen--

Signed and Sealed this  
Third Day of September, 2019

Andrei Iancu  
*Director of the United States Patent and Trademark Office*